United States Patent
Dictus

(10) Patent No.: US 8,545,595 B2
(45) Date of Patent: Oct. 1, 2013

(54) PHOTON INDUCED FORMATION OF METAL COMPRISING ELONGATED NANOSTRUCTURES

(75) Inventor: Dries Dictus, Kessel-lo (BE)

(73) Assignees: IMEC, Leuven (BE); Katholieke Universiteit Leuven, K.U. Leuven R&D, Leuven (BE)

(*) Notice: Subject to any disclaimer, the term of this patent is extended or adjusted under 35 U.S.C. 154(b) by 9 days.

(21) Appl. No.: 13/343,364

(22) Filed: Jan. 4, 2012

(65) Prior Publication Data

US 2012/0107550 A1 May 3, 2012

Related U.S. Application Data

(62) Division of application No. 12/147,856, filed on Jun. 27, 2008, now Pat. No. 8,114,483.

(60) Provisional application No. 61/050,848, filed on May 6, 2008, provisional application No. 60/970,844, filed on Sep. 7, 2007, provisional application No. 60/948,129, filed on Jul. 5, 2007.

(30) Foreign Application Priority Data

Nov. 1, 2007 (EP) .................................... 07075949

(51) Int. Cl.
*B22F 1/00* (2006.01)
*B22F 1/02* (2006.01)
*C22C 1/05* (2006.01)

(52) U.S. Cl.
USPC ........................................... 75/253; 427/576

(58) Field of Classification Search
USPC ................... 427/576; 428/76; 977/762, 895
See application file for complete search history.

(56) References Cited

U.S. PATENT DOCUMENTS

| 2005/0239286 A1 | 10/2005 | Wu et al. |
| 2006/0038990 A1 | 2/2006 | Habib et al. |
| 2007/0087470 A1 | 4/2007 | Sunkara et al. |

FOREIGN PATENT DOCUMENTS

WO    WO 2004/059682    7/2004

OTHER PUBLICATIONS

Tamirisa et al. (Plasma etching of copper films at low temperature, Microelectronic Engineering 84 (2007) 105-108).*
Molares et al., Advanced Materials, 2001, vol. 13, No. 1, Jan. 5, pp. 62-65.
Qin, Y. et al. Preparation of aligned Cu nanowires by room-temperature reduction of CuO nanowires in electron cyclotron resonance hydrogen plasma. Nanotechnology 18 (2007) 035608.
Tamirisa et al. "Plasma etching of copper films at low temperature", Microelectronic Engineering 84 (2007) 105-108.
Xuchuan et al., Nano Letters, vol. 2, No. 12, Dec. 2002, 1333-1338.
Yong et al., Nanotechnology 18 (2007) 035608 (4pp).

* cited by examiner

*Primary Examiner* — Weiping Zhu
(74) *Attorney, Agent, or Firm* — Knobbe Martens Olson & Bear, LLP

(57) ABSTRACT

The preferred embodiments provide a method for forming at least one metal comprising elongated nanostructure on a substrate. The method comprises exposing a metal halide compound surface to a photon comprising ambient to initiate formation of the at least one metal comprising elongated nanostructure. The preferred embodiments also provide metal comprising elongated nanostructures obtained by the method according to preferred embodiments.

22 Claims, 11 Drawing Sheets

PHOTON INDUCED FORMATION OF METAL COMPRISING ELONGATED NANOSTRUCTURES

CROSS-REFERENCE TO RELATED APPLICATIONS

This application is a divisional of U.S. application Ser. No. 12/147,856 filed on Jun. 27, 2008, which claims the benefit under 35 U.S.C. §119(e) of U.S. Provisional Application No. 60/948,129 filed on Jul. 5, 2007, U.S. Provisional Application No. 60/970,844 filed on Sep. 7, 2007, and U.S. Provisional Application No. 61/050,848 filed on May 6, 2008, and claims the benefit under 35 U.S.C. §119(a)-(d) of European Application No. 07075949.3 filed on Nov. 1, 2007, the disclosures of which are hereby expressly incorporated by reference in their entirety and are hereby expressly made a portion of this application.

FIELD OF THE INVENTION

Elongated nanostructures such as nanowires are provided. More particularly, a method is provided for forming at least one elongated nanostructure which comprises metal on a substrate and to elongated nanostructures which comprise metal thus obtained.

BACKGROUND OF THE INVENTION

In the field of molecular nano-electronics, semiconductor nano-crystals, nanowires (NWs) and carbon nanotubes (CNTs) are becoming more and more important as components for various electronic devices. These NWs and CNTs are unique for their size, shape and physical properties and have, depending on their electrical characteristics, been used in electronic devices such as e.g. diodes and transistors. Although a lot of progress has been made on both fabrication and understanding of the limits of performance of these NWs and CNTs, there are still key issues to be addressed for potential technological applications.

In the last years, a lot of effort has been put in the synthesis of elongated nanostructures such as nanowires. Due to their restricted size, these structures exhibit novel physical and chemical properties and have opened up a large new field of basic research as well as possible applications. Metallic nanowires show high potential for being used in a wide range of advanced applications. Copper, for example, is of particular interest because of its high electrical conductivity. With rapid shrinking in size of electronic devices, copper nanowires may play an essential role to form interconnects in devices in nano-electronics and opto-electronics.

In Adv. Mater. 2001, 13(1), 62-65, Molares et al. report the fabrication of cylindrical poly- and single-crystalline copper wires by means of a template method. Copper wires with diameters between 60 nm and 500 nm and aspect ratios (ratio of length to diameter) up to 500 can be obtained. A disadvantage of the method may be that the use of a template is required for obtaining free-standing wires.

The growth of CuO nanowires by heating Cu in an oxygen atmosphere has been reported in the past (Xuchuan et al., Nano Letters, 2(12), 2002, pp. 1333-1338). However, the method described in this paper may be relatively slow, i.e. it may take several hours to grow the nanowires, and may require high temperatures, i.e. temperatures of up to 700° C.

Yong et al. reported reduction of CuO to form Cu nanowires in a plasma (Nanotechnology 18 (2007) 035608 (4 pp)). Aligned Cu nanowires were prepared by the reduction of aligned CuO nanowires in electron cyclotron resonance (ECR) hydrogen plasma at room temperature.

CuO appears to be the only material that can be used presumably because problems can occur if the heating step just results in evaporation from the surface instead of growing wires, e.g. for volatile compounds starting from about 150° C.

SUMMARY OF THE INVENTION

A good method is provided for forming at least one metal comprising elongated nanostructure on a substrate and to metal comprising elongated nanostructures thus obtained.

With metal comprising elongated nanostructure is meant a nanostructure that comprises metal.

The method according to preferred embodiments does not require the use of catalyst particles.

By using the method according to preferred embodiments elongated nanostructures can be formed which extend from the substrate in a direction, when the substrate is lying in a plane, substantially perpendicular to the plane of the substrate. Furthermore, by using the method according to preferred embodiments free-standing metal comprising elongated nanostructures can be formed.

The above advantages are provided by a method and device according to the preferred embodiments.

In a first aspect, the preferred embodiments provide a method for forming at least one metal comprising elongated nanostructure onto a substrate. The method comprises:

providing a substrate comprising at least a metal surface layer, converting at least part of the metal surface layer into a metal halide compound, e.g. a metal halide compound different from a metal fluoride compound, exposing the metal halide compound, e.g. a metal halide compound different from a metal fluoride compound to a photon comprising ambient to initiate formation of the at least one metal comprising elongated nanostructure, and during exposure to the photon comprising ambient, volatile copper halide products are formed and the concentration of the volatile copper halide products in the reaction chamber is above the saturation level of the volatile copper halide products to initiate formation of at least one metal comprising elongated nanostructure.

It is an advantage of the method according to preferred embodiments that it does not require provision of catalyst particles to form the elongated nanostructures. Deposition of catalyst nanoparticles is an additional step in the process which may take some time. Providing catalyst nanoparticles may be difficult to perform because the particles need to be deposited uniformly. Furthermore, if elongated nanostructures with particular sizes, e.g. with a particular diameter, have to be formed, the size of the nanoparticles has to be chosen carefully as, in general, the size of the nanoparticles determines the diameter of the elongated nanostructures grown from these nanoparticles.

According to preferred embodiments, the metal may be copper and the elongated nanostructure may be a copper comprising elongated nanostructure. According to these embodiments, providing a substrate comprising at least a metal surface layer may be performed by providing a substrate comprising at least a copper surface layer. Converting at least part of the metal surface layer into a metal halide compound may be performed by converting at least part of the copper surface layer into a copper halide compound.

According to preferred embodiments, converting at least part of the metal surface layer into a metal halide compound may be performed by exposing at least part of the metal surface layer to a halogen comprising gas.

According to other preferred embodiments, converting at least part of the metal surface layer into a metal halide compound may be performed by exposing at least part of the metal surface layer to a halogen comprising plasma.

Exposing at least part of the metal surface layer to a halogen comprising plasma may be performed at 600 Watt and 10 mTorr during an exposure time period of 10 seconds.

The halogen comprising plasma may be a HBr or $Cl_2$ comprising plasma.

Exposing the metal halide compound to a photon comprising ambient may be performed by exposing the metal halide compound to a He, Ar or H comprising plasma.

According to preferred embodiments, the metal halide compound may be $CuCl_x$ and the photon comprising ambient may be a He plasma, and exposing the metal halide compound to a photon comprising ambient may be performed at 1000 Watt and 30 mTorr without substrate bias during an exposure time period of at least 30 seconds, for example for a time period of 120 seconds.

According to other preferred embodiments, the metal halide compound may be $CuBr_x$ and the photon comprising ambient may be a He plasma, and exposing the metal halide compound to a photon comprising ambient may be performed at 1000 Watt and 80 mTorr without substrate bias during an exposure time period of at least 30 seconds, for example for a time period of 120 seconds.

Providing a substrate comprising at least a metal surface layer may be performed by:
  providing a substrate, and
  providing a metal surface layer onto the substrate.

According to preferred embodiments, the method may furthermore comprise, before providing a metal surface layer, providing a protective layer and/or a barrier layer onto the substrate. The barrier layer may be used to avoid diffusion of metal into the substrate. According to preferred embodiments, the method may comprise providing one of a protective layer or a barrier layer. According to other preferred embodiments, the method may comprise providing both a protective layer and a barrier layer.

The method may furthermore comprise, before converting at least part of the metal surface layer into a metal halide compound, providing a pattern onto the metal surface layer.

Providing a pattern onto the metal surface layer may be performed by:
  providing a layer of material, e.g. dielectric material, onto the metal surface layer, and
  providing at least one hole in the layer of material.

According to preferred embodiments, the method may furthermore comprise, after formation of the metal comprising elongated nanostructure, removing the pattern.

According to still further embodiments, the method may furthermore comprise, before exposing the metal halide compound to a photon comprising ambient, cleaning the substrate.

Cleaning the substrate may be performed by a $H_2$ or $N_2$ plasma.

In a further aspect, the use is provided of the method according to preferred embodiments for forming copper comprising elongated nanostructures.

In still a further aspect, the preferred embodiments provides a metal comprising elongated nanostructure comprising a combination of a metal and a metal halide compound, e.g. a metal halide compound different from a metal fluoride compound, the metal forming the core of the elongated nanostructure and the metal halide compound, e.g. a metal halide compound different from a metal fluoride compound forming the shell of the elongated nanostructure, the shell surrounding the core.

The metal comprising elongated nanostructure may comprise between 60% and 99% metal and between 1% and 40% metal halide.

The metal comprising elongated nanostructure may comprise more than 95% metal and less than 5% metal halide.

The metal comprising elongated nanostructure may have a length between 500 nm and 40 μm and a diameter between 50 nm and 200 nm.

According to preferred embodiments, the metal may be copper and the metal halide may be a copper halide.

According to preferred embodiments, the copper halide may be $CuCl_x$ or $CuBr_x$.

According to preferred embodiments, the metal comprising elongated nanostructure may be a metal comprising nanowire.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the preferred embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All figures are intended to illustrate some aspects and preferred embodiments. The figures are depicted in a simplified way for reason of clarity. Not all alternatives and options are shown and therefore the invention is not limited to the content of the given drawings. Like numerals are employed to reference like parts in the different figures.

Figure 1A:
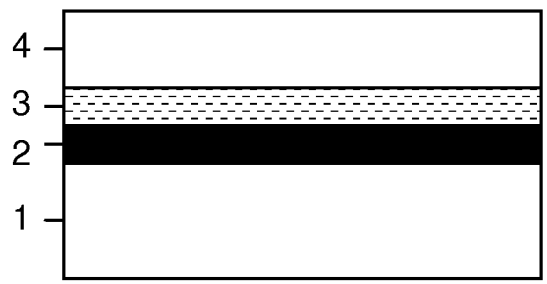
FIGS. 1A to 1C illustrate subsequent processing steps in a method according to preferred embodiments.
Figure 1B:
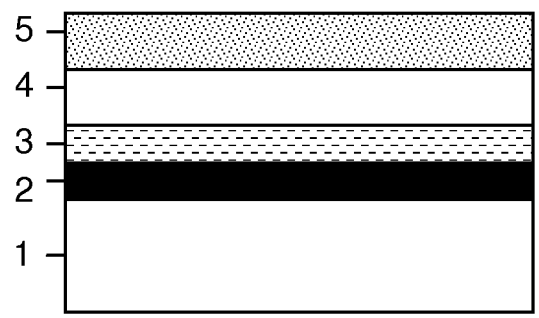
Figure 1C:
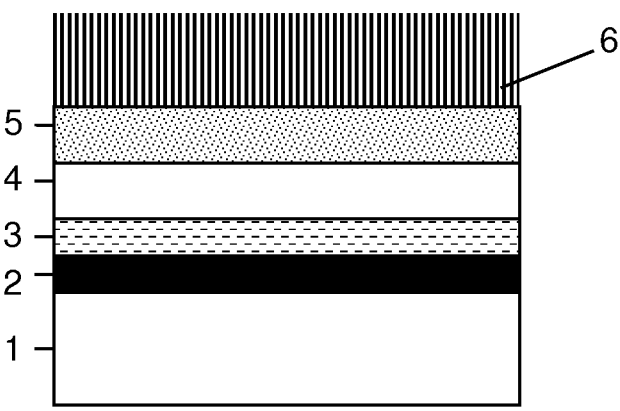

In the different figures, the same reference signs refer to the same or analogous elements.

DETAILED DESCRIPTION OF THE PREFERRED EMBODIMENT

The preferred embodiments will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the preferred embodiments, the only relevant components of the device are A and B.

Reference throughout this specification to "one embodiment" or "an embodiment" means that a particular feature, structure or characteristic described in connection with the embodiment is included in at least one embodiment of the preferred embodiments. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

The following terms are provided solely to aid in the understanding of the invention.

With the term "elongated nanostructures" is meant any two-dimensionally confined pieces of solid material in the form of wires (nanowires), tubes (nanotubes), rods (nanorods) and similar elongated substantially cylindrical or polygonal nanostructures having a longitudinal axis. A cross-dimension of the elongated nanostructures preferably lies in the region of 1 to 500 nanometers.

The term "pattern" as referred to in the claims and the description are used to define structures (e.g. vias, trenches, and the like) in a layer deposited onto a substrate e.g. a wafer substrate. The patterns are formed on the wafer substrates using patterning tools known by a person skilled in the art as a combination of lithography techniques (photolithography and e-beam lithography) and etching techniques (such as reactive ion etching (RIE)).

The invention will now be described by a detailed description of several preferred embodiments. It is clear that other preferred embodiments can be configured according to the knowledge of persons skilled in the art without departing from the true spirit or technical teaching of the invention, the invention being limited only by the terms of the appended claims.

The preferred embodiments provides a method for forming at least one metal comprising elongated nanostructure onto a substrate and to metal comprising elongated nanostructures thus obtained. The method comprises:

providing a substrate comprising at least a metal surface layer, converting at least part of the metal surface layer into a metal halide compound, e.g. a metal halide compound different from a metal fluoride compound, exposing the metal halide compound, e.g. a metal halide compound different from a metal fluoride compound to a photon comprising ambient to initiate formation of the at least one metal comprising elongated nanostructure, and during exposure to the photon comprising ambient, volatile copper halide products are formed and the concentration of the volatile copper halide products in the reaction chamber is above the saturation level of the volatile copper halide products to initiate formation of at least one metal comprising elongated nanostructure.

Throughout the description and the claims, with metal comprising elongated nanostructure is meant a nanostructure that at least comprises metal.

By using the method according to preferred embodiments, metal comprising elongated nanostructure, e.g. copper comprising nanowires (Cu—NW), may grow onto the substrate, more particularly may grow vertically onto the substrate. With growing vertically onto the substrate is meant that, when the substrate is lying in a plane, the metal comprising elongated nanostructures grow in a direction substantially perpendicular to the plane of the substrate. Furthermore, the metal comprising elongated nanostructures may be free-standing nanostructures. With free-standing nanostructures is meant that the nanostructures form sole entities on the substrate and are not entangled with or do not contact neighbouring nanostructures.

The method according to preferred embodiments can be used to form elongated nanostructures comprising a combination of a metal and a metal halide compound, such as e.g. MeCl, and/or $MeBr_x$, with Me being a metal. For example, the metal halide compound may be a metal halide compound different from a metal fluoride compound. Metal comprising elongated nanostructures formed by a method according to preferred embodiments comprise a combination of a metal and a metal halide compound. The metal forms a core of the elongated nanostructure and the metal halide compound forms a shell of the elongated nanostructure, the shell substantially completely surrounding the core.

According to preferred embodiments, the elongated nanostructures formed and comprising a metal core and metal halide compound shell may be further exposed to a halide comprising ambient so as to substantially completely convert the metal of the core into a metal halide. In that way, an elongated nanostructure completely formed of a metal halide compound and comprising no pure metal anymore may be formed. Examples include $CuCl_x$ or $CuBr_x$ nanowires. $CuCl_x$ or $CuBr_x$ nanowires are semiconductors with large bandgaps (e.g. about 3.4 eV for $CuCl_x$ and about 3 eV for $CuBr_x$), which makes them suitable to be used in optoelectronic devices or for sensor applications.

According to other preferred embodiments, the metal halide compound shell may be converted into metal by e.g. using a $H_2$ plasma. In that way, pure metal elongated nanostructures may be formed. Pure metal elongated nanostructure may, for example, be used as interconnects.

Depending on the composition, the metal comprising elongated nanostructures formed by the method according to preferred embodiments can show conducting or semiconducting properties.

An advantage of the method according to preferred embodiments is that it does not require the use of catalyst particles. Deposition of catalyst nanoparticles is an additional step in the process which may take some time. Providing catalyst nanoparticles may be difficult to perform because the particles need to be deposited uniformly. Furthermore, if elongated nanostructures with particular sizes, e.g. with a particular diameter, have to be formed, the size of the nanoparticles has to be chosen carefully as, in general, the size of the nanoparticles determines the diameter of the elongated nanostructures grown from these nanoparticles.

Hereinafter, the method according to preferred embodiments will be described by means of copper comprising nanowires (Cu—NWs). It has to be understood that this is not intended to limit the invention in any way. The method according to preferred embodiments may also be applied for forming other metal comprising nanowires, and for forming any metal comprising elongated nanostructure.

FIGS. 1A to 10 illustrate subsequent processing steps in a method according to preferred embodiments to form copper comprising nanowires (Cu—NWs) 6 on a substrate 1. It has to be understood that this is only by way of an example and is not intended to limit the invention in any way. According to other embodiments, the method may furthermore comprise other steps, or may comprise a different sequence of steps.

According to the embodiment illustrated in FIGS. 1A to 10, in a first step a substrate 1 is provided. The substrate 1 can be any suitable substrate 1. In preferred embodiments, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. An example of a suitable substrate 1 which may be used with preferred embodiments may be a Si wafer.

Onto the substrate 1, optionally a protecting layer 2 and/or a barrier layer 3 may be provided, e.g. deposited. The protecting layer 2 may, for example, be a $SiO_2$ layer, and may, for example, have a thickness of 500 nm. The barrier layer 3 may, for example, be a TaN, TiN, TaN/TiN or SiC layer and may have a thickness in the range of, for example, 10 nm to 20 nm. The barrier layer 3 may be used to avoid diffusion of metal, in the example given copper, into the substrate 1. It has to be noted that, according to preferred embodiments, both a protecting layer 2 and a barrier layer 3 may be provided. According to other embodiments, only one of a protecting layer 2 or a barrier layer 3 may be provided. According to still other embodiments, none of these layers 2, 3 may be provided.

In a next step a copper surface layer 4 is provided. The copper layer 4 may, for example, be deposited by known deposition techniques such as Plasma Vapor Deposition (PVD) or Electrochemical Deposition (ECD) or electroless plating. The copper layer 4 may, for example, have a thickness in the range of between 200 nm and 1000 nm. However, according to preferred embodiments the copper layer 4 may also have a thickness of larger than 1000 nm. The initial thickness of the copper layer 4, i.e. the thickness of the copper layer 4 after deposition and before processing according to preferred embodiments is proceeded, may have an influence on the length of the Cu—NWs formed later in the process or may at least have an influence on the copper halide compound formed (see further). The structure obtained after deposition of the copper surface layer 4 is illustrated in FIG. 1A.

In a next step, the copper surface layer 4 is at least partly halogenated. In other words, at least part of the copper surface layer 4 is converted into a copper halide. For example, the copper halide may be a copper halide different from a copper fluoride. A problem that can arise with fluoride as halogenide is that the copper fluoride formed is inert with respect to the reaction to form the NWs (see further) because it is more stable than other copper halides such as e.g. copper bromide and copper chloride. Converting the copper surface layer 4 into a copper halide may be done by at least partly exposing the copper surface layer 4 to a halogen comprising ambient, such as a halogen comprising plasma or halogen comprising gas, to form a metal halide ($MeH_x$) surface 5 (see FIG. 1B). The halogen comprising plasma or halogen comprising gas may, for example, be a chlorine or bromine comprising plasma or a chlorine or bromine comprising gas to respectively form a $CuCl_x$ or $CuBr_x$ surface 5. Preferably, when the halogen comprising ambient is formed by a chlorine comprising gas or plasma, it may be a $Cl_2$-gas or a $BCl_3$-gas or a $Cl_2$-plasma. When the halogen comprising ambient is formed by a bromine comprising gas or plasma, it may be a HBr gas or a HBr plasma.

The exposure time period may be in the range of between 1 second and 100 seconds, and may, for example, be 10 seconds. An example of an exposure process suitable to be used with the method according to preferred embodiments may be performed by exposing at least part of the copper surface layer 4 to a Cl comprising ambient, such as a $Cl_2$ plasma with a power of 600 Watt, a pressure of 10 mTorr, without substrate bias and during an exposure time period of 10 seconds. With power of a plasma is meant the power at which the plasma is generated. Another example of an exposure process suitable to be used with the method according to preferred embodiments may be performed by exposing at least part of the copper surface layer 4 to a suitable Br comprising ambient, such as a HBr plasma with a power of 600 Watt, a pressure of 10 mTorr, without substrate bias and during an exposure time period of 10 seconds.

Instead of a halogen comprising plasma, a halogen comprising gas such as e.g. a bromine and/or chlorine comprising gas may be used. In case a halogen comprising gas is used to convert the copper surface layer 4 into a copper halide surface 5, and a native oxide is present on the copper surface layer 4, e.g. by long exposure to air, the copper surface layer 4 may be cleaned first to remove the native oxide such that a clean copper surface is available for reaction with the halogen comprising gas or plasma.

The substrate 1 comprising the at least partly halogenated copper layer 5 is then exposed to photon comprising ambient, e.g. light source or a plasma, to create a photon induced reaction. The photon comprising ambient used needs to provide enough energetic active photons. The photons serve to break certain chemical bonds. By breaking these bonds, the growth of the copper comprising nanowire is initiated. Examples of suitable photon comprising ambients which may be used according to preferred embodiments may be light sources such as ARC lamps, halogen lamps, fluorescent lamps and suitable plasmas to be used with the preferred embodiments may be a He plasma, a H plasma or an Ar plasma. Preferably, the photon comprising ambient may be ignited directly above the copper halide surface 5. With directly above the copper halide surface 5 is meant that the photon comprising ambient is in direct contact with the copper halide surface 5. This may be obtained by providing the substrate with the copper halide surface 5 in the photon comprising ambient.

Exposure may be performed during a time period of between 30 seconds and 300 seconds to induce Cu—NW growth. The time period of exposure may also be longer than 300 seconds. However, according to preferred embodiments, it has been observed that an exposure time of longer than 300 seconds does not lead to a change in size of the NWs 7 any more. For example, the photon comprising ambient may be a He plasma and exposure may be performed with a power of 300 Watt for 7 seconds, followed by a power of 1000 Watt for 120 seconds, at a pressure in the range of between 20 mTorr and 100 mTorr and without substrate bias. Alternatively the photon comprising ambient may be an Ar or a H plasma. After exposure, Cu—NWs 6 are formed on the substrate 1 (see FIG. 1C). In this formation process, the copper halide surface 5 acts as a precursor for initiating the growth of Cu—NWs 6. With the copper halide surface 5 acting as a precursor is meant that the copper halide surface 5 can be used as a substance to grow the Cu—NWs 6 from.

According to preferred embodiments, during the step of exposing the copper halide surface layer to a photon comprising ambient, formation of volatile copper halide products is initiated. These volatile copper halide products are responsible for the formation of the Cu—NW or in other words these copper halide products are re-deposited onto the surface in the form of Cu—NW. The volatile copper halide products may be partly removed from the reaction chamber during exposure of the copper halide surface layer to the photon comprising ambient provided that the concentration of these volatile copper halide products is not below the saturation level of the volatile copper halide products in the reaction chamber because otherwise no re-deposition of these copper halide products to form Cu—NW is possible (prevented).

The minimum allowable concentration of the volatilized copper halide products in the reaction chamber (saturation level) can be derived from equation [1]:

$$S = \frac{P_a}{P_e} \qquad [1]$$

In which S is the saturation ratio of the gas phase in the reaction chamber, $P_a$ is the real partial pressure of the volatilized halogenated copper products in the reaction chamber and $P_e$ the theoretical equilibrium partial pressure of volatilized halogenated copper products at a given pressure and temperature. The partial pressure of the volatilized halogenated copper products in the reaction chamber can be influenced by the incoming gas flow(s) in the reaction chamber (e.g. He gas flow). The following equation [2] describes the relationship of the incoming gas flow on the actual concentration of gasses in the reaction chamber at a given pressure and temperature:

$$D = D_0 \frac{T}{T_0} \frac{P_0}{P} \qquad [2]$$

In which $D_0$, $T_0$, $P_0$ are respectively the gas flow, temperature (25° C.) and pressure (1 atm) of the incoming gas (He) and D, T en P the actual flow, temperature and pressure in the etch chamber. Since the substrate is kept at low temperature special attention has to be paid to the removal of volatile copper halide products out of the reaction chamber. This requires in general that the incoming gas flow rate is correlated to the exhaust flow rate.

According to preferred embodiments, the copper halide surface 5 may first be cleaned to remove oxides and/or other contaminants present at the copper halide surface 5, before the Cu—NW growth is initiated. Cleaning may be done by any suitable cleaning technique known by a person skilled in the art. For example, when the contaminant is e.g. $CuO_x$, a $H_2$ or $N_2$ plasmas may be used to remove the contaminants.

The purity of the Cu—NWs 6 depends on the composition of the copper halide compound which is used as a 'precursor'. With the method according to preferred embodiments, metal comprising nanowires 6, or in general metal comprising elongated nanostructures, can be formed with a diameter of smaller than 500 nm, for example a diameter of between 50 nm and 200 nm, for example with a diameter of 100 nm, and with a length of between 500 nm and 40 µm, for example with a length of 20 µm or 30 µm. The nanowires 6, or in general the elongated nanostructures, formed by the method according to preferred embodiments may comprise a combination of a metal and a metal halide compound. The nanowires may comprise crystalline, e.g. monocrystalline or polycrystalline, metal and metal halide compounds. According to preferred embodiments, the nanowires 6, or in general the elongated nanostructures, may comprise between 60% and 99% or between 60% and 80% metal and between 1% and 40% or between 1% and 20% metal halide compound. For example, when a $CuCl_x$, e.g. $CuCl_2$ layer 5 is formed by exposing a Cu surface layer 4 to e.g. $BCl_3$ the Cu—NWs 6 formed may comprise 95% copper and 5% impurities which may in the present example mainly be $CuCl_x$ (or alternatively, when HBr is used as a plasma, $CuBr_x$). For obtaining pure copper nanowires, or in general pure metal elongated nanostructures, as already described above, the halide compounds can be removed by reducing them to pure copper, or in general to pure metal by exposing them to a $H_2$ plasma. Conversion of the metal halide, e.g. copper halide, into pure metal, e.g. pure copper, then occurs through a simple reduction reaction. According to other embodiments and as described earlier, metal halide compound elongated nanostructures comprising substantially no pure metal any more may be obtained by exposing the nanowires 6 to a halide.

In the above described example, the substrate 1 may be any suitable substrate provided with a copper surface layer 4, or in general a metal surface layer 4, on top of it. However, according to other preferred embodiments, the substrate 1 may be a bulk copper substrate, or in general, may be a bulk metal substrate.

According to another embodiment, a pattern may be provided onto the copper surface layer 4 (or copper substrate) before the substrate 1 is exposed to the photon comprising ambient in order to obtain selective growth of Cu—NWs 6. With selective growth of Cu—NWs 6 is meant that Cu—NWs 6 are grown only at predetermined locations on the substrate 1. Again, this embodiment will be described by means of copper nanowires (Cu—NWs). This is only for the ease of explanation and is not intended to limit the invention in any way. The method according to the present embodiment can also be applied for, in general, forming metal comprising elongated nanostructures on predetermined locations on a structure.

Figure 2A:
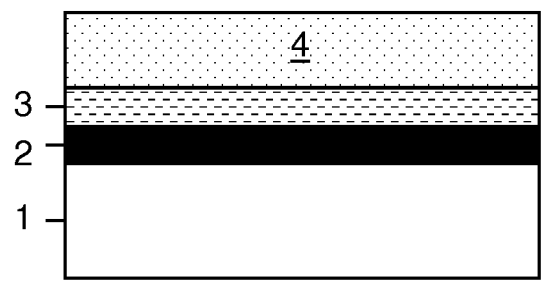
FIGS. 2A to 2E illustrate subsequent processing steps in a method according to preferred embodiments.
Figure 2B:
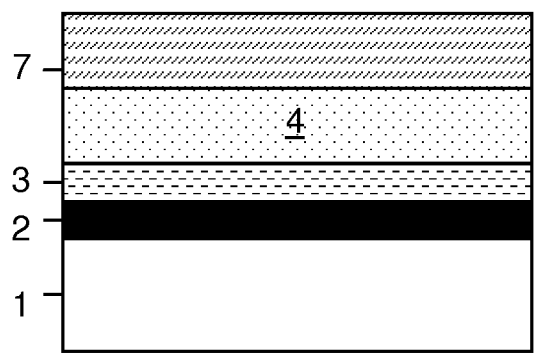
Figure 2C:
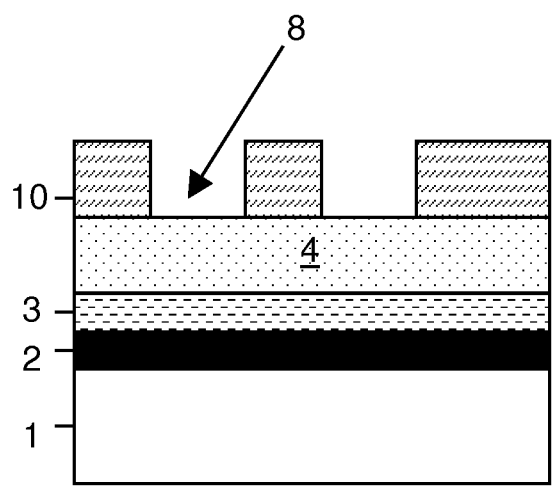

FIGS. 2A up to 2E illustrate subsequent processing steps in a method according to preferred embodiments to form Cu—NWs 6 at predetermined locations on a substrate 1 comprising at least a copper surface layer 4. The first steps of providing a substrate 1, optionally providing a protecting layer 2 and/or a barrier layer 3, and providing a copper surface layer 4 are similar to the steps described in the embodiment above with respect to FIG. 1A and the structure obtained after performing these steps is illustrated in FIG. 2A.

Figure 8:
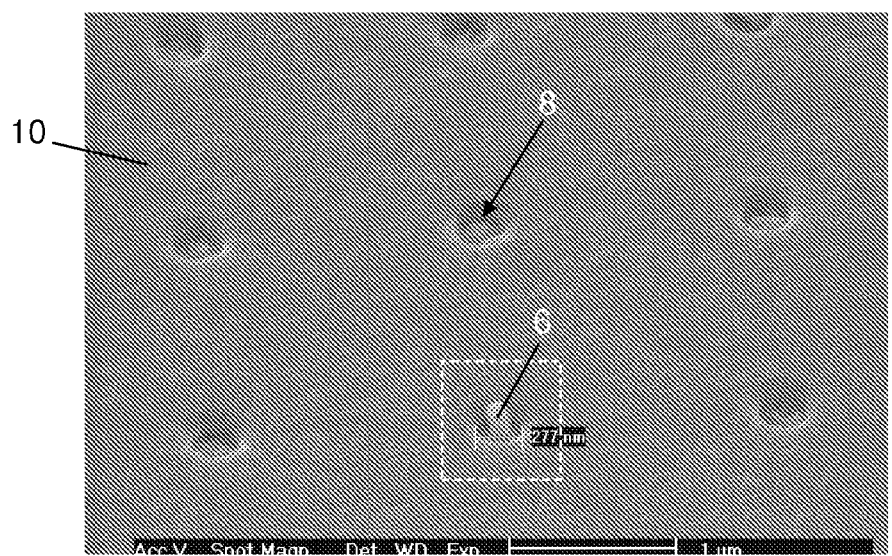
FIGS. 8 to 11 illustrate formation of nanostructures according to preferred embodiments.

After the steps of providing a substrate 1, depositing a protecting layer 2 and a barrier layer 3 and depositing a copper surface layer 4, a pattern 10 may be provided onto the copper surface layer 4. The pattern 10 may be provided on top of the copper surface layer 4 such that some parts of the copper surface layer 4 are exposed and some parts are covered by the pattern and are thus not exposed. To form the pattern 10 onto the copper surface layer 4 an extra layer 7 (see FIG. 2B) may be deposited and holes or openings 8 may be formed in this layer 7 (see FIG. 2C). This may be done by means of, for example, a combination of lithographic patterning and etching. The extra layer 7 may comprise a dielectric material such as $SiO_2$, a low-k dielectric layer such as Chemically Vapour deposited (CVD) SiCO(H) or an organic spin-on low-k layer such as Silk®. According to preferred embodiments, the pattern 10 may be a dummy pattern or, in other words, may be a sacrificial pattern that may be removed after Cu—NWs 6 are formed. Alternatively the pattern 10 may be a permanent pattern that will not be removed after Cu—NWs 6 are formed. The permanent pattern 10 can then, for example, be used to form interconnect structures in Back-End-of-Line (BEOL) processing of a semiconductor device. FIG. 8 illustrates the presence of a pattern 10 with holes or openings 8 on the substrate 1.

Figure 2D:
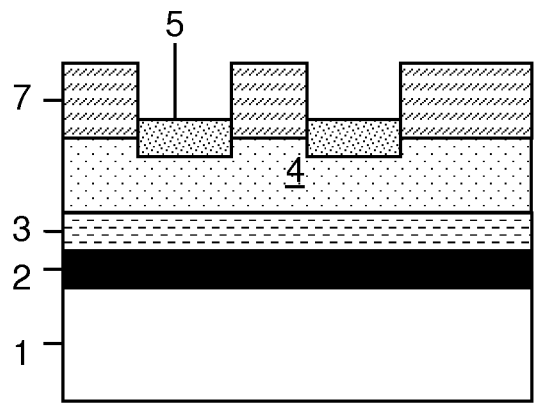

In a next step exposed or non-covered parts of the copper surface layer 4 are at least partly halogenated by exposing these parts of the copper surface layer 4 to a halogen comprising ambient, e.g. a chlorine or bromine comprising ambient, as described in the previous embodiment, to form a metal halide ($MeH_x$) compound surface 5, in the example given a Cu halide compound such as e.g. $CuCl_x$ and/or $CuBr_x$ (see FIG. 2D). Optionally, the Cu surface layer 4 may, before exposing to the halogen comprising ambient, first be cleaned to remove possible contaminants. In case the contaminant is $CuO_x$, a $H_2$ or $N_2$ plasmas can be used.

Figure 2E:
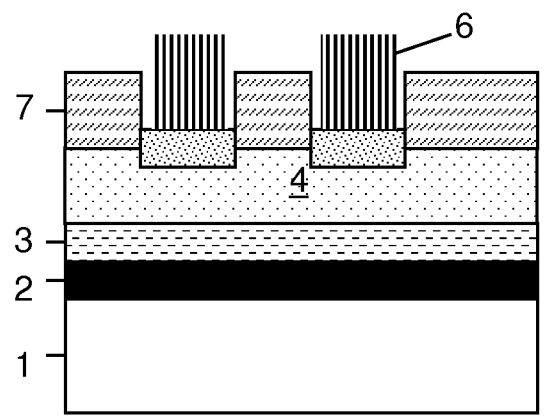
Figure 9:
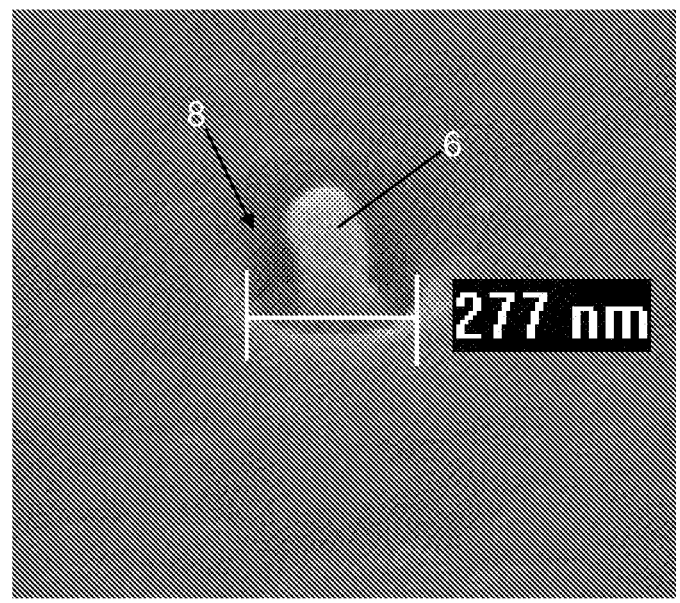

In a next step the Cu halide, e.g. $CuCl_x$ and/or $CuBr_x$, surface 5 is exposed to a photon comprising ambient, e.g. light source, to initiate a photon induced reaction as described above to form Cu—NWs 6 into the holes 8 of the pattern 10 such that selective growth of Cu—NWs 6 is obtained (see FIG. 2E). According to preferred embodiments, the copper halide surface 5 may be cleaned before initiating growth of Cu—NWs 6 to remove possibly present contaminants. Optionally, after formation of the Cu—NWs 6, the pattern 10 may be removed. This may be done by any suitable technique known by a person skilled in the art. FIG. 9 shows a detail of the part of FIG. 8 illustrated with the dashed square. FIG. 9 illustrates the growth of a NW 6 in a hole 8 of the pattern 10.

FIG. 3 schematically illustrates the influence of the initial thickness of the copper surface layer 4, i.e. the thickness of the copper surface layer 4, before exposure to the halogen comprising ambient on the formation of the copper halide compound 5 and on the morphology and length of the Cu—NWs 6 formed on the copper halide compound 5.

Figure 3A:
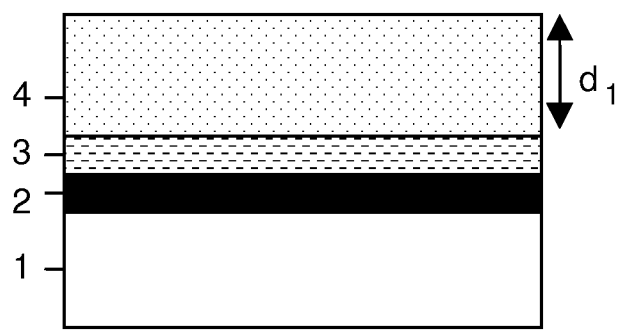
FIGS. 3A to 3F schematically illustrate the influence of the initial thickness of the metal surface layer to formation of metal halide compound and on the morphology and length of the nanostructures formed.

FIGS. 3A up to 3C illustrate formation of Cu—NWs 6 starting from a copper surface layer 4 with initial thickness of approximately 1000 nm ($d_1$) which results in formation of a Cu halide compound, e.g. $CuCl_x$ or $CuBr_x$, layer 5 having a thickness ($d_2$) of between approximately 1000 nm and 1500 nm after exposure to a halogen comprising ambient, e.g. to a $Cl_2$ or HBr plasma during 10 seconds. Due to the transformation of part of the copper surface layer 4 to a Cu halide compound, e.g. $CuCl_x$ or $CuBr_x$, surface 5, the initial thickness ($d_1$) of the copper surface layer 4 is reduced to a smaller thickness ($d_{1'}$) (see FIG. 3B). It has been observed that the thickness of the layer 5 of Cu halide compound formed may be about 5 times higher than the amount of copper that has been used to form the Cu halide compound. For example, in the example given, if the layer 5 of Cu halide compound has a thickness $d_2$ of 1500 nm, about 300 nm of the copper surface layer 4 will have been disappeared, or in other words, the thickness of the copper surface layer 4 may have been reduced with 300 nm. In the example given, the thickness $d_{1'}$ of the copper surface layer 4 may, after formation of the copper halide compound be 200 nm. After exposure of the Cu halide compound, e.g. $CuCl_x$ or $CuBr_x$, surface 5 to a photon comprising ambient, e.g. light source, to initiate a photon induced reaction as described above, Cu—NWs 6 are formed (see FIG. 3C). The Cu—NWs 6 may have a length ($d_3$) in the range of between 20 μm and 30 μm after exposure to, for example, a He plasma for 120 seconds.

Figure 3B:
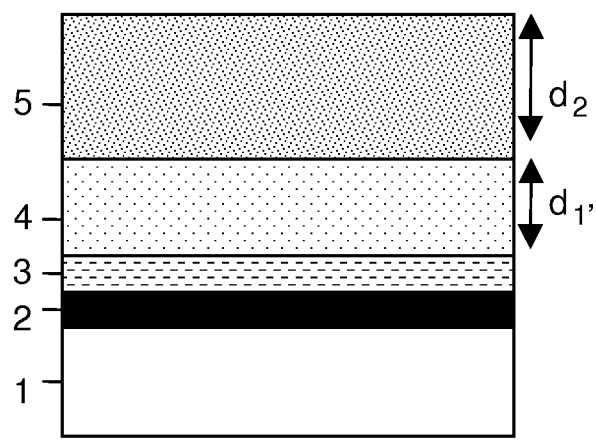
Figure 3C:
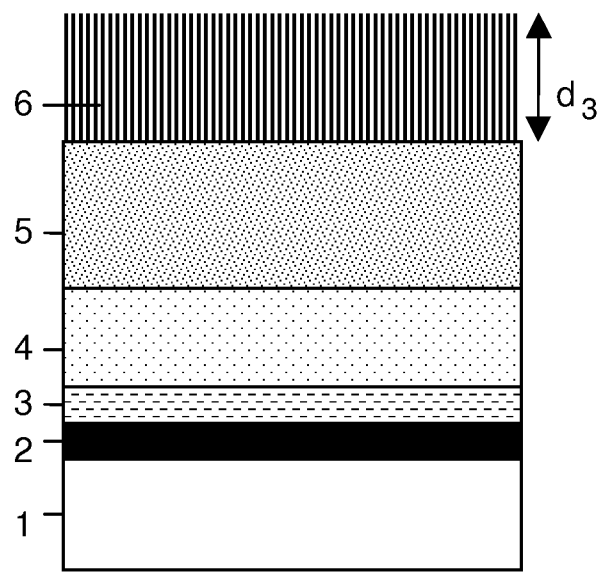
Figure 3D:
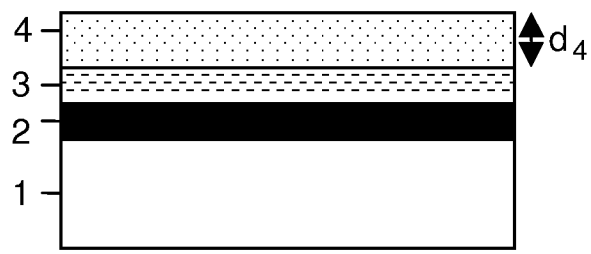
Figure 3E:
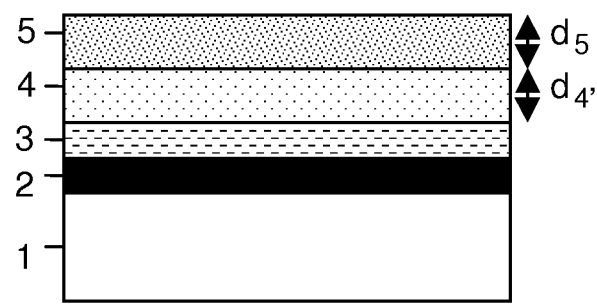
Figure 3F:
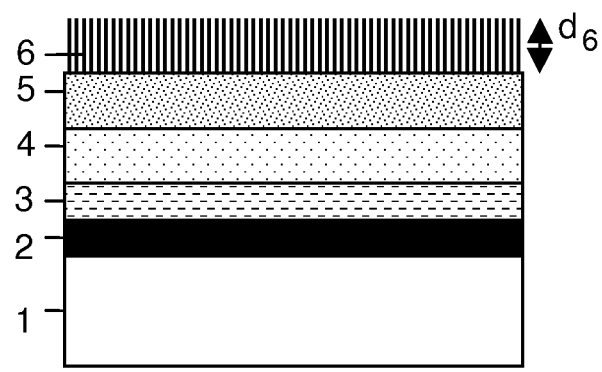

FIGS. 3D to 3F illustrate formation of Cu—NWs 6 using the same process conditions as described for the process with respect to FIGS. 3A to 3C but now starting from a copper surface layer 4 with a lower initial thickness, i.e. with an initial thickness of 500 nm ($d_4$) (see FIG. 3D) which results in formation of a Cu halide compound, e.g. $CuCl_x$ or $CuBr_x$, surface 5 with a thickness ($d_5$) of between approximately 300 nm and 500 nm after, for example 10 seconds exposure to a $Cl_2$ or HBr plasma (see FIG. 3E). Due to the transformation of part of the copper surface layer 4 to a Cu halide compound, e.g. $CuCl_x$ or $CuBr_x$, surface 5 the initial thickness ($d_4$) of the copper surface layer 4 is reduced to a smaller thickness ($d_{4'}$). In a similar way as described above, it has been observed that the thickness $d_5$ of the layer 5 of Cu halide compound formed may be about 5 times higher than the amount of copper that has been used to form the Cu halide compound. For example, if the layer 5 of Cu halide compound has a thickness ($d_5$) of 500 nm, about 100 nm of the copper surface layer 4 will have been disappeared, or in other words, the thickness ($d_{4'}$) of the copper surface layer 4 may have been reduced with 100 nm. In the example given, the thickness ($d_{4'}$) of the copper surface layer 4 may, after formation of the copper halide compound be 400 nm. After exposure of the Cu halide compound, e.g. $CuCl_x$ or $CuBr_x$, surface 5 to a photon comprising ambient, e.g. light source, Cu—NWs 6 are formed with a much smaller length ($d_6$) compared to the Cu—NWs 6 formed with the process as illustrated in FIGS. 3A to 3C, i.e. with a thickness ($d_6$) of approximately 10 μm after, for example, 300 seconds exposure to a He plasma (see FIG. 3F).

From the above it is clear that the initial thickness of the copper surface layer 4 may determine the thickness of the Cu halide compound layer 5 and the length of the Cu—NWs 6 formed. By providing a copper surface layer 4 with a suitable thickness, nanowires 6, or in general metal comprising elongated nanostructures, with a predetermined length may be formed by using the method according to preferred embodiments.

Figure 4A:
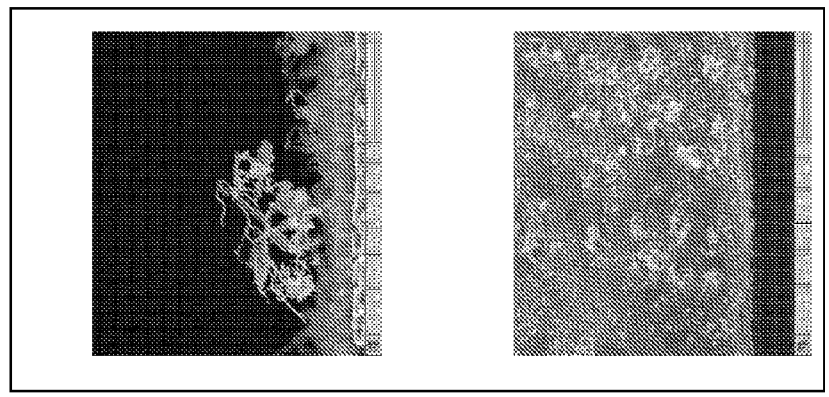
FIGS. 4A to 4C illustrate the influence of pressure in the plasma chamber during exposure of a $CuCl_x$ layer to a He plasma on formation of nanostructures.
Figure 4B:
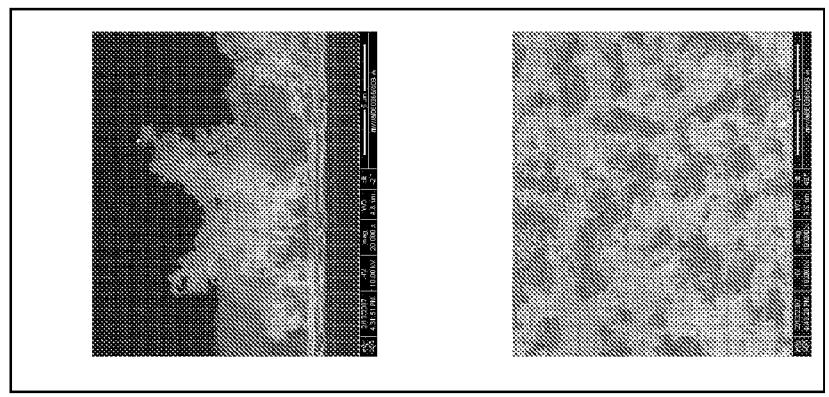
Figure 4C:
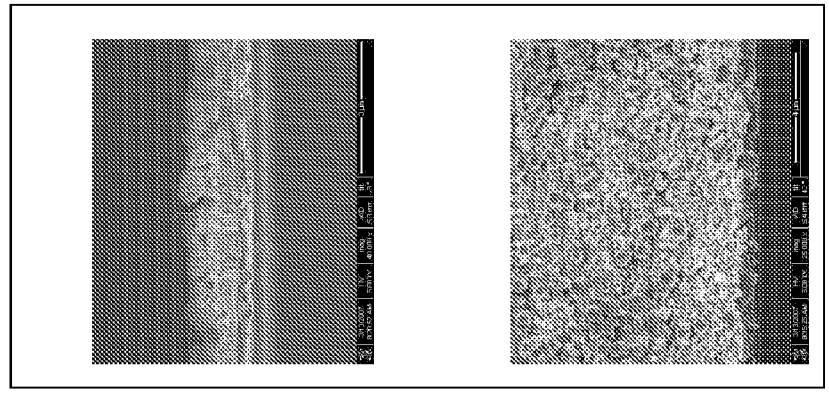

FIG. 4A to 4C illustrate the influence of pressure in the plasma chamber during exposure of a $CuCl_x$ layer 5 to a He plasma for nanowire growth. The upper drawings show a cross-section and the lower drawings show top views of the substrate 1 with Cu—NWs 6 grown on top. FIG. 4A illustrates a SEM picture for Cu—NWs 6 grown by exposing to a He plasma at 7 mTorr. As can be seen from the figure, this results in rather isolated, free-standing Cu—NWs 6. FIG. 4B illustrates a SEM picture for Cu—NWs 6 grown by exposing to a He plasma at 30 mTorr. This results in massive growth of Cu—NWs 6. With massive growth is meant that a huge amount of nanowires is present at the substrate 1 and that neighbouring nanowires are entangled with each other. FIG. 4C illustrates a SEM picture for Cu—NWs 6 grown by exposing to a He plasma at 80 mTorr. As can be seen, this does not result in formation of Cu—NWs 6, but in formation of hillocks.

The above described experiment illustrates that pressure during exposure to a photon comprising ambient may be an important parameter in order to obtain Cu—NWs with desired properties. By tuning the pressure in the plasma chamber during growth of the nanowires 6, free-standing nanowires, or in general free-standing elongated nanostructures, may be formed with the method according to preferred embodiments. Special attention must be paid that during exposure to the photon comprising ambient, the concentration of the volatile copper halide products in the reaction chamber needs to be above the saturation level of the volatile copper halide products to initiate formation of at least one metal comprising elongated nanostructure.

Figure 5B:
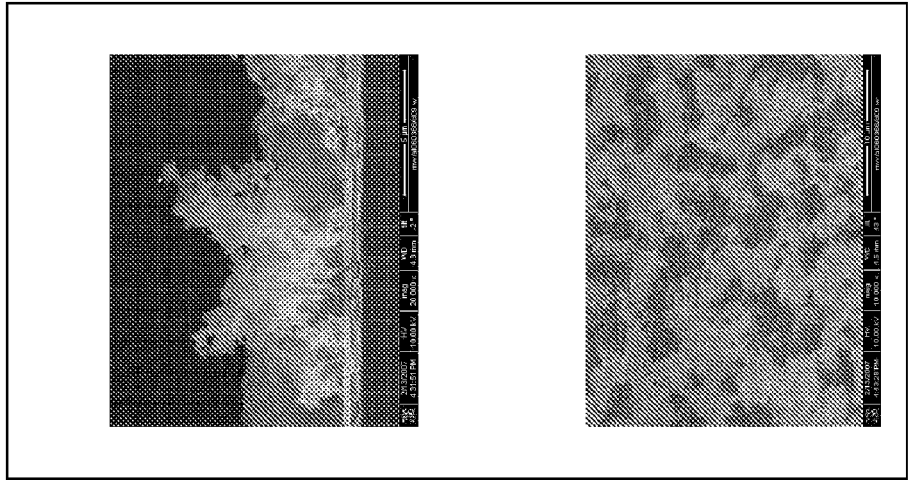
FIGS. 5A and 5B illustrate the influence of plasma power during exposure of a $CuCl_x$ layer to a He plasma on formation of nanostructures.
Figure 5A:
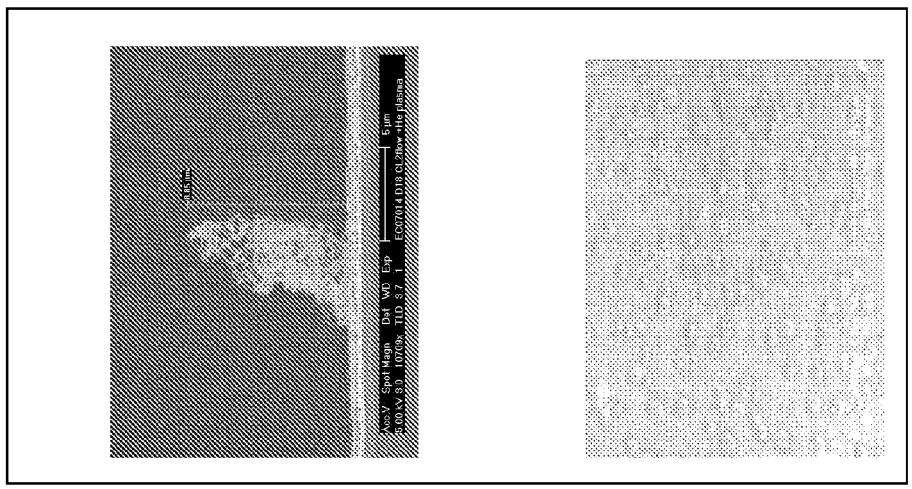

FIGS. 5A and 5B illustrate the influence of plasma power during exposure of the Cu halide layer 5 to a He plasma on nanowire growth. The upper drawings show a cross-section and the lower drawings show top views of the substrate 1 with Cu—NWs 6 on top. FIG. 5A illustrates a SEM picture for Cu—NWs 6 grown by exposing to a He plasma at a power of 300 Watt for a time period of 600 seconds. As can be seen, this results in isolated, free-standing Cu—NWs 6. FIG. 4B illustrates a SEM picture by exposing a He plasma at a power of 1000 Watt for 600 seconds. This results in massive growth of Cu—NWs 6 and a high coverage of the surface of the substrate 1.

Hence, from the above described experiment it can be seen that by tuning the power in the plasma chamber during nanowire growth, free-standing Cu—NWs 6, or in general free-standing metal comprising elongated nanostructures may be formed by the method according to preferred embodiments.

Figure 10:
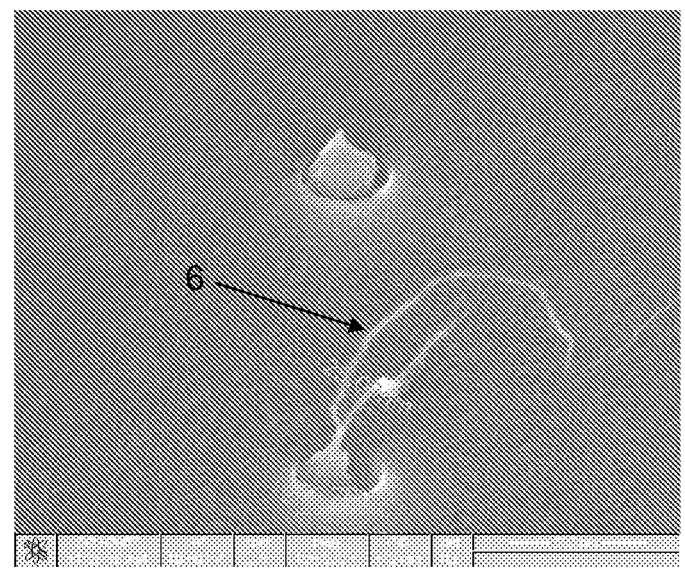
Figure 11:
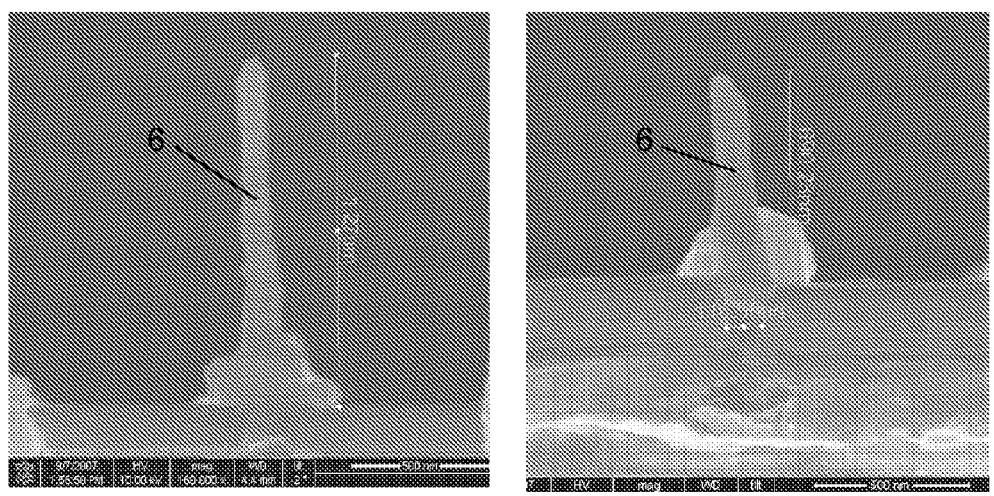

Depending on process parameters such as e.g. pressure, temperature, halide source, the NWs 6 formed may have different shapes. FIG. 10 illustrates Cu NWs 6 grown starting from a $CuCl_x$ layer formed of exposing Cu to a $Cl_2$ ambient. FIG. 11 illustrates Cu NWs 6 grown starting from a $CuBr_x$ layer formed of exposing Cu to a HBr ambient. It can be seen that in case of FIG. 10 the NWs 6 have a 'curled' shape while in case of FIG. 11 the NWs 6 have a straight shape. It has to be understood that also curled shapes can be obtained for Cu NWs 6 starting from a $CuBr_x$ layer and that straight shapes can be obtained for Cu NWs 6 starting from a $CuCl_x$ layer when process parameters are changed.

Methods according to preferred embodiments will hereinafter be illustrated by some experiments. It has to be understood that these experiments are only illustrative and are not intended to limit the invention in any way.

Experiment 1

Formation of Cu—NWs Starting from a $CuCl_x$ Layer by Exposure to a He Plasma

A copper layer 4 was first deposited on a Si substrate 1. A barrier layer 3 was deposited prior to deposition of the copper surface layer 4. The barrier layer 3 may, for example, be a $SiO_2$ layer. The thickness of the copper layer 4 may be in the range of between 500 nm and 1000 nm. First, the copper surface layer 4 was exposed to a $Cl_2$ plasma to convert the copper layer 4 into a $CuCl_x$ layer 5. The process parameters used to perform this step are summarized in Table 1. The experiments were conducted in a Lam Versys 2300 etch chamber.

TABLE 1

Working example of process conditions using a Lam Versys 2300 etch chamber for performing the step of exposing a Cu layer to a $Cl_2$ gas to form a $CuCl_x$ layer.

| parameter | Setting | |
|---|---|---|
| Power in plasma chamber | 600 | Watt |
| Pressure in plasma chamber | 10 | mTorr |
| Exposure time | 10 | seconds |
| Substrate bias | no | |

In the next step, the $CuCl_x$ layer 5 was exposed to a He plasma to initiate the growth of Cu—NWs 6. The process parameters to perform this step are summarized in Table 2. The experiments were conducted in a Lam Versys 2300 etch chamber.

TABLE 2

Working example of process conditions using a Lam Versys 2300 etch chamber for performing the step of exposing a $CuCl_x$ layer to a He plasma to form Cu-NWs.

| parameter | Setting |
| --- | --- |
| Power in plasma chamber | 1000 Watt (*) |
| Pressure of He plasma | 30 mTorr |
| Exposure time | 120 seconds |
| Substrate bias | no |

(*) starting with 7 seconds at 300 Watt

Experiment 2

Formation of Cu—NWs Starting from a $CuBr_x$ Layer by Exposure to a He Plasma

A copper layer 4 is first deposited on a Si substrate 1. A barrier layer 3 was deposited prior to deposition of the copper surface layer 4. The barrier layer 3 may, for example, be a $SiO_2$ layer. The thickness of the copper layer 4 may be in the range of between 500 nm and 1000 nm. First, the copper surface layer 4 was exposed to a HBr plasma to convert the copper layer 4 into a $CuBr_x$ layer 5. The process parameters used to perform this step are summarized in Table 3. Experiments were conducted in a Lam Versys 2300 etch chamber.

TABLE 3

Working example of process conditions using a Lam Versys 2300 etch chamber for performing the step of exposing a Cu layer to a HBr gas to form a $CuBr_x$ layer.

| parameter | Setting |
| --- | --- |
| Power in plasma chamber | 600 Watt |
| Pressure in plasma chamber | 10 mTorr |
| Exposure time | 10 seconds |
| Substrate bias | no |

Next, the $CuBr_x$ layer 5 was exposed to a He plasma to initiate the growth of Cu—NWs 6. The process parameters used to perform this step were the same as described for the fist example and are summarized in Table 2 above. Experiments were conducted in a Lam Versys 2300 etch chamber.

Experiment 3

Auger Electron Spectroscopy (AES) Experiments to Characterize the Cu—NWs Formed by the Method According to Preferred Embodiments By using AES the composition and chemistry of a surface can be examined by measuring the energy of electrons emitted from that surface when it is irradiated with electrons having an energy in the range of between 2 keV and 50 keV. During the experiments, it was tried to focus the AES beam on top of the Cu—NWs 6 formed by the method according to preferred embodiments. The spot size for AES is about 1 $\mu m^2$ which resulted in good focusing on the Cu—NWs 6. The penetration depth of the AES beam is less than 10 nm so there could be differentiated between the nanowires 6 and the copper halide surface 5.

Figure 6:
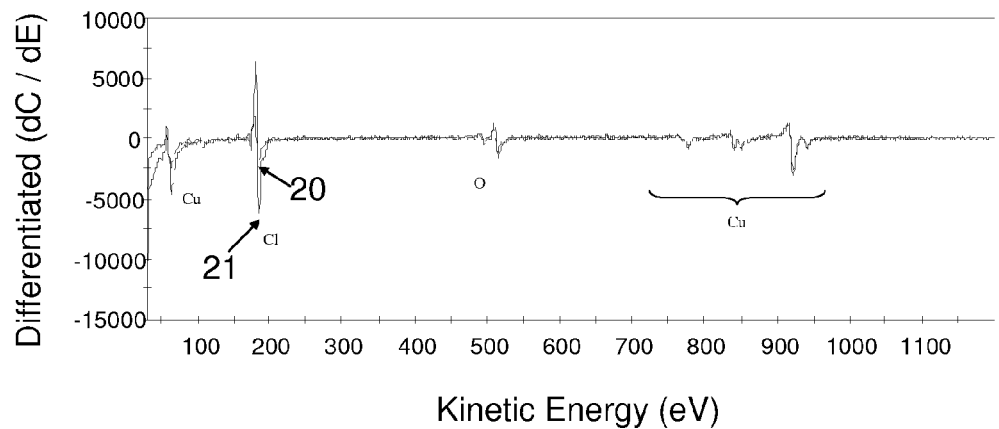
FIG. 6 shows an AES survey scan recorded on a single Cu—NW grown starting from a $CuCl_x$ layer and on the substrate surface underneath the Cu—NW.

In case the Cu surface 4 was converted into a $CuCl_x$ surface using a $Cl_2$ comprising gas and the photon induced reaction was initiated using a He plasma (see example 1) both the Cu—NWs 6 formed and the $CuCl_x$ surface 5 next to the Cu—NWs 6 comprise Cu, Cl and O. FIG. 6 illustrates the AES survey scan recorded on one Cu—NW 6 starting from a $CuCl_x$ layer 5 and on the surface underneath the Cu—NW 6. Both curves are coinciding and cannot be distinguished very well in the figure. The Cl concentration (indicated with reference number 20) in the Cu—NWs 6 seems to be lower than the Cl concentration on the $CuCl_x$ surface (indicated with reference number 21). Oxygen is present because samples were older than a few days and oxidation had occurred.

Figure 7A:
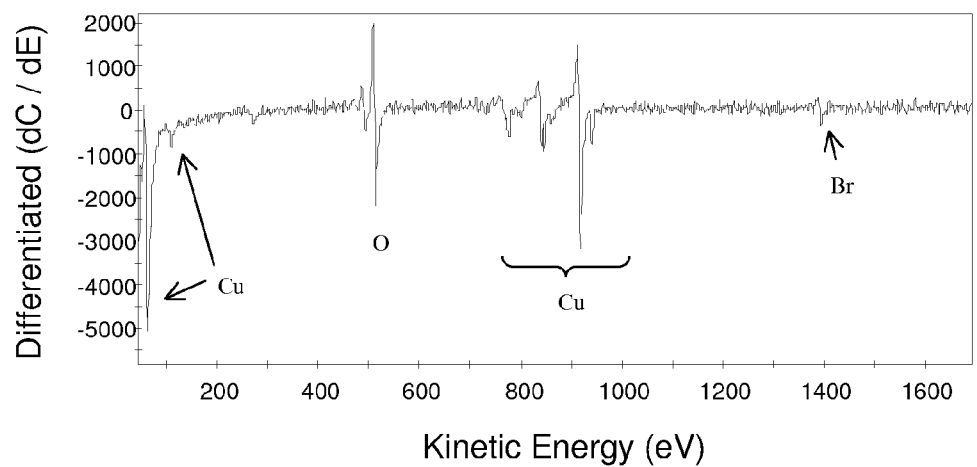
FIG. 7A shows an AES survey scan recorded on a single Cu—NW grown starting from a CuBr$_x$ layer and FIG. 7B shows an AES survey scan recorded on the substrate surface underneath.
Figure 7B:
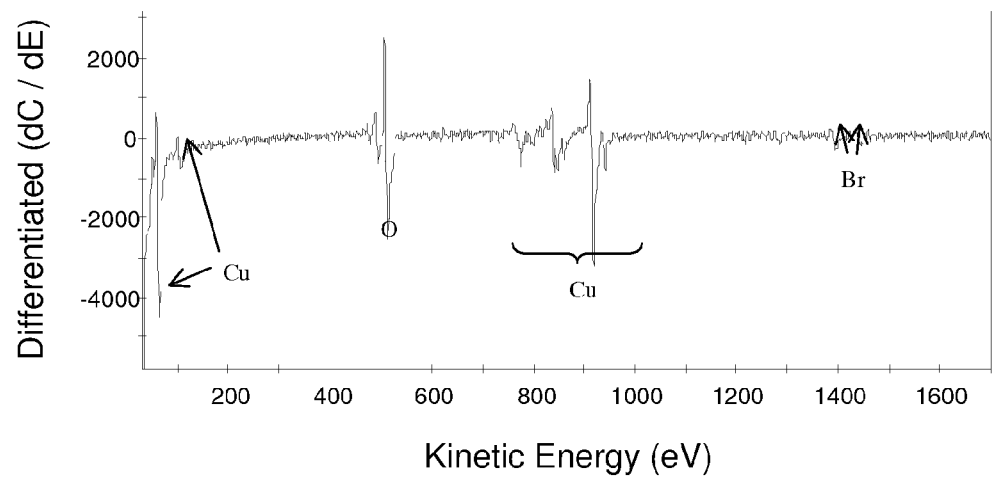

In case the Cu surface 4 was converted into a $CuBr_x$ surface 5 using a HBr comprising gas and the photon induced reaction was initiated using a He plasma (see example 2) both the Cu—NWs 6 formed and the $CuBr_x$ surface 5 next to the Cu—NWs formed comprise Cu, Br and O. FIG. 7A illustrates the AES survey scan recorded on one Cu—NW 6 starting from the $CuBr_x$ layer and FIG. 7B illustrates the AES survey scan recorded on the substrate surface underneath the Cu—NWs 6. The Br concentration in the Cu—NWs 6 seems to be lower than the Br concentration on the $CuBr_x$ surface 5. Oxygen is present because samples were older than a few days.

In case the Cu surface 4 was transferred into a $CuCl_x$ surface 5 using a $BCl_3$ comprising gas and the photon induced reaction was created using a He plasma both the Cu—NWs 6 formed and the $CuCl_x$ surface 5 next to the Cu—NWs 6 formed comprise Cu, Cl and O. The Cl concentration in the Cu—NWs 6 seems to be lower than on the $CuCl_x$ surface. Oxygen is present because samples were older than a few days and oxidation had occurred.

Experiment 4

Ion Beam Analysis (IBA) Experiments to Characterize the Cu—NWs Formed by the Method According to Preferred Embodiments Ion beam analysis is an analytical technique involving the use of ion beams with an energy in the order of MeV to examine the composition of and to obtain elemental depth profiles in single crystals. Measurements were performed at Cu—NWs 6 which were fabricated starting from a Cu surface layer 4 which was converted into a $CuCl_x$ surface 5 using a $BCl_3$ comprising gas and the photon induced reaction was initiated using a He plasma. In this experiment, 17 MeV iodine ions were bombarded onto the Cu—NWs 6. The Cu—NWs 6 were inspected after analysis and seemed to be intact so only the nanowires 6 are probed and not the surface. This can be concluded because the NWs 6 form a dense structure through which the iodine ions cannot penetrate unless the NWs 6 are destroyed by these iodine ions. Table 5 shows the composition of Cu—NWs 6 determined by using Ion Beam Analysis according to this experiment.

TABLE 5

Composition of Cu-NW using Ion Bean Analysis in which the Cu-NW are bombarded with 17MeV iodine ions.

| compound | % |
| --- | --- |
| H | 13.4 |
| Cl | 8.5 |
| C | 1.6 |
| O | 29.8 |
| Cu | 46.8 |

Experiment 5

GI-XRD Experiments to Characterize the Cu—NWs Formed by the Method According to Preferred Embodiments In this experiment, measurements were performed on $CuCl_x$ and $CuBr_x$ surfaces 5 without Cu—NWs 6 to find out which peaks on the samples comprising nanowires 6 really originate from the presence of these nanowires 6.

From comparison of the presence of a $CuCl_x$ peak between samples with and without Cu—NWs 6 and after oxidation (in clean room (CR) environment) it is concluded that diffraction peaks in the spectra of the samples with Cu—NWs 6 originate only from the Cu—NWs 6 themselves.

In case the Cu surface 4 was converted into a $CuCl_x$ surface using a $Cl_2$ comprising gas and the photon induced reaction was initiated using a He plasma the Cu—NWs 6 formed comprise both crystalline $CuCl_x$ and crystalline Cu. After oxidation in the CR environment $CuCl_x$ disappeared and was replaced with probably CuO or $Cu_2O$.

In case the Cu surface 4 was transferred into a $CuBr_x$ surface 5 using a HBr comprising gas and the photon induced reaction was initiated using a He plasma the Cu—NWs 6 formed comprise both crystalline $CuBr_x$ and crystalline Cu. The Cu—NWs 6 seemed to resist well to oxidation because after a few days almost no other peaks appear in the spectrum.

In case the Cu surface 4 was transferred into a $CuBr_x$ surface 5 using a $BCl_3$ comprising gas and the photon induced reaction was initiated using a He plasma the Cu—NWs 6 formed comprise both crystalline $CuBr_x$ and crystalline Cu. After oxidation in the CR environment $CuBr_x$ disappeared and was replaced with probably CuO or $Cu_2O$. It has to be noted that in this case a very intense Cu peak was observed in the spectrum which indicates a large amount of crystalline Cu present in the Cu—NWs 6.

Experiment 6

EDX (Energy Dispersive X-ray Analysis) Experiments to Characterize the Cu—NWs Formed by the Method According to Preferred Embodiments Energy dispersive X-ray spectroscopy (EDS or EDX) is an analytical tool used for chemical characterization. Being a type of spectroscopy, it relies on the investigation of a sample through interactions between light and material. The characterization capabilities of this technique are in large part due to the fundamental principle that each element of the periodic table has a unique electronic structure and thus a unique response to electromagnetic waves. The spot size for probing was approximately 1 $\mu m^3$. The samples were inspected in cross section to differentiate between substrate 1 and Cu—NWs 6.

In case the Cu surface 4 was converted into a $CuCl_x$ surface 5 using a $Cl_2$ comprising gas and the photon induced reaction was initiated using a He plasma the Cu—NWs 6 formed were found to comprise 20% $CuCl_x$ and 80% Cu.

In case the Cu surface 4 was converted into a $CuBr_x$ surface 5 using a HBr comprising gas and the photon induced reaction was initiated using a He plasma the Cu—NWs 6 formed were found to comprise 20% $CuBr_x$ and 80% Cu.

In case the Cu surface 4 was transferred into a $CuBr_x$ surface 5 using a $BCl_3$ comprising gas and the photon induced reaction was initiated using a He plasma the Cu—NWs 6 formed were found to comprise 5% $CuBr_x$ and 95% Cu.

The above described experiments show that with the method according to preferred embodiments it is possible to form metal comprising elongated nanostructures comprising a high percentage of metal. By tuning parameters of the process, metal comprising elongated nanostructures 6 with predetermined properties may be obtained.

It is to be understood that although preferred embodiments, specific constructions and configurations, as well as materials, have been discussed herein for devices according to the preferred embodiments, various changes or modifications in form and detail may be made without departing from the scope of this invention as defined by the appended claims. For example, steps may be added or deleted to methods described within the scope of the preferred embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the preferred embodiments. At the very least, and not as an attempt to limit the application of the doctrine of equivalents to the scope of the claims, each numerical parameter should be construed in light of the number of significant digits and ordinary rounding approaches.

What is claimed is:

1. A metal comprising elongated nanostructure having a shell and a core, and comprising a combination of a metal and a metal halide, wherein the core of the elongated nanostructure comprises the metal and wherein the shell of the elongated nanostructure comprises the metal halide and substantially completely surrounds the core, and wherein the elongated nanostructure is a free-standing nanostructure that is not entangled with or in contact with neighboring nanostructures.

2. The metal comprising elongated nanostructure of claim 1, wherein the metal comprising elongated nanostructure comprises from about 60% to about 99% metal and from about 1% to about 40% metal halide.

3. The metal comprising elongated nanostructure of claim 2, wherein the metal comprising elongated nanostructure comprises more than about 95% metal and less than about 5% metal halide.

4. The metal comprising elongated nanostructure of claim 1, the metal comprising elongated nanostructure having a length and a diameter, wherein the length of the metal comprising elongated nanostructure is from about 500 nm to about 40 µm and wherein the diameter of the metal comprising elongated nanostructure is from about 50 nm to about 200 nm.

5. The metal comprising elongated nanostructure of claim 1, wherein the metal is copper and the metal halide is a copper halide.

6. The metal comprising elongated nanostructure of claim 5, wherein the copper halide is $CuCl_x$ or $CuBr_x$.

7. The metal comprising elongated nanostructure of claim 1, wherein the metal comprising elongated nanostructure is a metal comprising nanowire.

8. The metal comprising elongated nanostructure of claim 1, wherein the metal is copper and the elongated nanostructure is a copper comprising elongated nanostructure, and wherein the core comprises at least a copper surface layer.

9. The metal comprising elongated nanostructure of claim 1, wherein the metal halide is $CuCl_x$.

10. The metal comprising elongated nanostructure of claim 1, wherein the metal halide is $CuBr_x$.

11. The metal comprising elongated nanostructure of claim 1, wherein the core comprises a metal surface layer on a substrate.

12. The metal comprising elongated nanostructure of claim 11, wherein at least one of a protective layer and a barrier layer is situated between the metal surface layer and the substrate.

13. The metal comprising elongated nanostructure of claim 11, wherein the metal surface layer is patterned.

14. The metal comprising elongated nanostructure of claim 11, wherein the metal surface layer comprises at least one hole.

15. The metal comprising elongated nanostructure of claim 1, wherein the core of the elongated nanostructure consists essentially of the metal and wherein the shell of the elongated nanostructure consists essentially of the metal halide and completely surrounds the core.

16. The metal comprising elongated nanostructure of claim 1, wherein a length of the metal comprising elongated nanostructure is from about 500 nm to about 40 μm.

17. The metal comprising elongated nanostructure of claim 1, wherein a diameter of the metal comprising elongated nanostructure is from about 50 nm to about 200 nm.

18. The metal comprising elongated nanostructure of claim 1, growing vertically onto a substrate in a direction substantially perpendicular to a plane of the substrate.

19. The metal comprising elongated nanostructure of claim 18, wherein the substrate comprises a surface layer of the metal.

20. The metal comprising elongated nanostructure of claim 18, wherein the substrate comprises a barrier layer configured to avoid diffusion of the metal into an underlying substrate layer, wherein the barrier layer is situated between the surface layer of the metal and the underlying substrate layer.

21. The metal comprising elongated nanostructure of claim 18, wherein the substrate comprises a layer of dielectric material atop the surface layer of metal, wherein the layer of dielectric material has at least one hole therein exposing the surface layer of metal, and wherein the metal comprising elongated nanostructure is situated on the exposed surface layer of metal.

22. The metal comprising elongated nanostructure of claim 18, wherein the metal comprising elongated nanostructure is one of a plurality of metal comprising elongated nanostructures, and wherein the plurality of metal comprising elongated nanostructures forms a predetermined pattern on the surface layer of metal.

* * * * *